(12) United States Patent
Bullington et al.

(10) Patent No.: US 7,194,016 B2
(45) Date of Patent: Mar. 20, 2007

(54) LASER-TO-FIBER COUPLING

(75) Inventors: Jeff A. Bullington, Orlando, FL (US); Richard A. Stoltz, Plano, TX (US); Laurent Vaissie, Oviedo, FL (US); Eric G. Johnson, Oviedo, FL (US); M. Gamal Moharam, Winter Park, FL (US)

(73) Assignees: The Research Foundation of the University of Central Florida, Orlando, FL (US); Infinite Photonics, Inc., Orlando, FL (US)

( * ) Notice: Subject to any disclaimer, the term of this patent is extended or adjusted under 35 U.S.C. 154(b) by 131 days.

(21) Appl. No.: 10/472,012

(22) PCT Filed: Mar. 22, 2002

(86) PCT No.: PCT/US02/09087

§ 371 (c)(1),
(2), (4) Date: Mar. 11, 2004

(87) PCT Pub. No.: WO02/078143

PCT Pub. Date: Oct. 3, 2002

(65) Prior Publication Data

US 2004/0165637 A1    Aug. 26, 2004

Related U.S. Application Data

(60) Provisional application No. 60/356,895, filed on Feb. 14, 2002, provisional application No. 60/344,972, filed on Dec. 21, 2001, provisional application No. 60/344,941, filed on Dec. 21, 2001, provisional application No. 60/315,160, filed on Aug. 27, 2001, provisional application No. 60/293,907, filed on May 25, 2001, provisional application No. 60/293,906, filed on May 25, 2001, provisional application No. 60/293,905, filed on May 25, 2001, provisional application No. 60/293,904, filed on May 25, 2001, provisional application No. 60/293,903, filed on May 25, 2001, provisional application No. 60/293,814, filed on May 25, 2001, provisional application No. 60/293,740, filed on May 25, 2001, provisional application No. 60/277,885, filed on Mar. 22, 2001.

(51) Int. Cl.
*H01S 3/08* (2006.01)
*H01S 5/026* (2006.01)

(52) U.S. Cl. .................... 372/108; 372/50.11

(58) Field of Classification Search ............ 372/108, 372/50.11
See application file for complete search history.

(56) References Cited

U.S. PATENT DOCUMENTS

| | | | |
|---|---|---|---|
| 3,798,060 A | 3/1974 | Reed et al. | |
| 4,097,118 A | 6/1978 | Hammer | |
| 4,262,996 A * | 4/1981 | Yao .............................. | 385/37 |
| 4,737,007 A | 4/1988 | Alferness et al. | |
| 4,847,844 A * | 7/1989 | Noda et al. .............. | 372/45.01 |
| 4,922,500 A | 5/1990 | Chang-Hasnain et al. | |
| 4,942,366 A | 7/1990 | Toda | |
| 4,952,019 A | 8/1990 | Evans et al. | |
| 4,958,357 A | 9/1990 | Kinoshita | |
| 5,019,787 A | 5/1991 | Carlson et al. | |
| 5,070,488 A | 12/1991 | Fukushima et al. | |
| 5,131,001 A | 7/1992 | Carlson | |
| 5,164,956 A | 11/1992 | Lang | |
| 5,220,573 A | 6/1993 | Sakata et al. | |
| 5,352,919 A | 10/1994 | Takano | |
| 5,457,569 A | 10/1995 | Liou et al. | |
| 5,673,284 A * | 9/1997 | Congdon et al. .......... | 372/50.1 |
| 5,784,399 A | 7/1998 | Sun | |
| 6,018,541 A | 1/2000 | Huang | |
| 6,064,783 A | 5/2000 | Congdon et al. | |
| 6,066,859 A | 5/2000 | Stegmueller | |
| 6,078,602 A | 6/2000 | Sato | |
| 6,219,369 B1 | 4/2001 | Portnoi et al. | |
| 6,236,773 B1 | 5/2001 | Butler et al. | |
| 6,282,219 B1 | 8/2001 | Butler et al. | |
| 6,356,674 B1 | 3/2002 | Davis et al. | |
| 6,392,979 B1 | 5/2002 | Yamamoto et al. | |
| 6,411,642 B1 | 6/2002 | Mazed | |
| 6,436,613 B1 | 8/2002 | Fallahi et al. | |
| 6,487,328 B2 | 11/2002 | Butler et al. | |

FOREIGN PATENT DOCUMENTS

| DE | 195 10 802 A1 | 9/1996 |
|---|---|---|
| JP | 59-198407 A | 11/1984 |
| JP | 5-299761 A | 11/1993 |
| JP | 08-262503 | 10/1996 |
| WO | WO 00/72450 A2 | 11/2000 |

OTHER PUBLICATIONS

Beyers, R., et al., "Phase Equilibria in Metal-Gallium-Arsenic Systems: Thermodynamic Considerations for Metallization Materials," Journal of Applied Physics, 61 (6), Mar. 15, 1987, pp. 2195-2202.

Sorokin, E., et al., "Diode-Pumped Ultra-Short-Pulse Solid-State Lasers," Applied Physics B72, 2001, pp. 3-14.

Perry, M.D., et al, "Ultrashort-Pulse Laser Machining of Dielectric Materials," Journal of Applied Physics, vol. 85, No. 9, May 1, 1999, pp. 6803-6810.

Venus, G.B., et al., "Picosecond Semiconductor Lasers with a Multisection Saturable Absorber Fabricated by Heavy Ion Implantation," Technical Physics Letters, vol. 25, No. 7, Jul. 1999, pp. 506-508.

Hagberg, M., et al., "Investigation of High-Efficiency Surface-Emitting Lasers with Blazed Grating Outcouplers," IEEE Journal of Quantum Electronics, vol. 32, No. 9, Sep. 1996, pp. 1596-1605.

Larsson, A., et al., "Grating Coupled Surface Emitters: Integrated Lasers, Amplifiers, and Beam Shaping Outcouplers," Part of the SPIE Conference on Testing, Packaging, and Reliability of Semiconductor Lasers IV, SPIE vol. 3626, San Jose, CA, Jan. 1999, pp. 190-201.

Hoogland, S., et al., "Passively Mode-Locked Diode-Pumped Surface-Emitting Semiconductor Laser," IEEE Photonics Technology Letters, vol. 12, No. 9, Sep. 2000, pp. 1135-1137.

Han, G., et al., "Laser-Plasma Interactions in 532 nm Ablation of Si," Journal of Applied Physics, vol. 88, No. 2, Jul. 15, 2000, pp. 1184-1186.

Treusch, H.-G., et al., "High-Brightness Semiconductor Laser Sources for Materials Processing: Stacking, Beam Shaping, and Bars," IEEE Journal of Selected Topics in Quantum Electronics, vol. 6, No. 4, Jul./Aug. 2000, pp. 601-613.

Eriksson, N., et al., "Highly Directional Grating Outcouplers with Tailorable Radiation Characteristics," IEEE Journal of Quantum Electronics, vol. 32, No. 6, Jun. 1996, pp. 1038-1047.

Bouchoule, S., et al., "Highly Attenuating External Cavity for Picosecond-Tunable Pulse Generation from Gain/Q-Switched Laser Diodes," IEEE Journal of Quantum Electronics, vol. 29, No. 6, Jun. 1993, pp. 1693-1700.

Huhse, D., et al., "Generation of electrically wavelength tunable ($\Delta\lambda$=40 nm) singlemode laser pulses from a 1.3 µm Fabry-Perot laser by self-seeding in a fibre-optic configuration," Electronics Letters, vol. 30, No. 2, Jan. 20, 1994, pp. 157-158.

Jiang, J., et al., "Broad tunability of grating coupled surface-emitting laser with external cavity," Electronics Letters, vol. 35, No. 21, Oct. 14, 1999, pp. 1847-1848.

Lundqvist, S., et al., "Generation of tunable single-mode picosecond pulses from an AlGaAs semiconductor laser with grating feedback," Appl. Phys. Lett. 43 (8), Oct. 15, 1983, pp. 715-717.

Roychoudhuri, C., et al., "Spectrally Stable Miniature External Cavity Laser Oscillator," SPIE vol. 1044 Optomechanical Design of Laser Transmitters and Receivers (1989), pp. 81-88.

Schell, M., et al., "Jitter and Dynamics of Self-Seeded Fabry-Perot Laser Diodes," IEEE Journal of Selected Topics in Quantum Electronics, vol. 1, No. 2, Jun. 1995, pp. 528-534.

Smolski, O., et al., "High power picosecond laser diode," published in the Proceeding of Connecticut Symposium on Microelectronics & Optoelectronics, YALE University, New Haven, USA, Mar. 16, 1999, pp. P11-1-P11-2.

Uemukai, M., et al., "Tunable External-Cavity Semiconductor Laser Using Monolithically Integrated Tapered Amplifier and Grating Coupler for Collimation," IEEE Photonics Technology Letters, vol. 12, No. 12, Dec. 2000, pp. 1607-1609.

\* cited by examiner

*Primary Examiner*—Armando Rodriguez
*Assistant Examiner*—Rory Finneren
(74) *Attorney, Agent, or Firm*—Slater & Matsil, L.L.P.

(57) ABSTRACT

Our wafer scale processing techniques produce chip-laser-diodes with a diffraction grating (78) that redirects output light out the top (88) and/or bottom surfaces. Generally, a diffraction grating (78) and integrated lens-grating (78) are used herein to couple light from the chip to an output fiber (74), and the lens-grating (78) is spaced from the diffraction grating (76). Preferably the diffraction grating (76) and integrated lens grating (78) are also used to couple light from the output fiber (74) back to the active region of the chip. The integrated lens-grating (78) can be in a coupling block (82). The use of a coupling block (82) can eliminate "facet-type damage". A coupling block (82) is generally used herein to couple light from the chip to an output fiber (74), and preferably to couple feedback reflected from the fiber (74) back to the chip.

20 Claims, 6 Drawing Sheets

LASER-TO-FIBER COUPLING

This application claims the priority benefit of the following U.S. Provisional Applications: Ser. No. 60/277,885, entitled ADVANCED LASER DIODE, filed on Mar. 22, 2001; Ser. No. 60/293,903, entitled LONG CAVITY LASER DIODE, filed on May 25, 2001; Ser. No. 60/293,905, entitled SLANTED FINGER LASER DIODE GRATING, filed on May 25, 2001; Ser. No. 60/293,907, entitled NON-REFLECTIVE TOP LASER DIODE CONTACT, filed on May 25, 2001; Ser. No. 60/293,904, entitled ETCH STOP FOR LASER DIODE, filed on May 25, 2001; Ser. No. 60/293,906, entitled ION IMPLANTED LASER DIODE GRATING, filed on May 25, 2001; Ser. No. 60/293,814, entitled PARTIALLY-DOPED LASER DIODE GRIN, filed on May 25, 2001; Ser. No. 60/293,740, entitled TUNGSTEN CONTACT FOR LASER DIODE, filed on May 25, 2001; Ser. No. 60/315,160, entitled ADVANCED GRATING-COUPLED LASER DIODE, filed on Aug. 27, 2001; Ser. No. 60/344,941, entitled ADVANCED GRATING-COUPLED LASER DIODE, filed on Dec. 21, 2001; Ser. No. 60/344,972, entitled COUPLED FIBER UNIT FOR GRATING-COUPLED LASER, filed on Dec. 21, 2001; and Ser. No. 60/356,895, entitled LASER TO FIBER COUPLING TECHNIQUES, filed on Feb. 14, 2002; all of which applications are hereby incorporated herein by reference.

CROSS-REFERENCE TO RELATED APPLICATIONS

This application is related to the following co-filed patent applications, all of which applications are hereby incorporated herein by reference:

| Docket No. | Title |
| --- | --- |
| PCT/US02/08764 | Controlling Passive Facet Reflections |
| PCT/US02/08774 | Shaped Top Terminal |
| PCT/US02/09012 | Ion Implanted Grating |
| 10/104,574 | InGaP Etch Stop |
| 10/104,501 | Tungsten Diode Contact |
| 10/104,333 | Low Reflectivity Grating |
| 10/105,098 | Low Diode Feedback |
| PCT/US02/09020 | Laser Diode with Output Fiber Feedback |
| 10/104,576 | Rapid Thermal Annealing of Waveguide |

TECHNICAL FIELD

These are improved devices and/or methods of making electrically-pumped chip-laser-diodes that are horizontal-light-generating but surface-emitting. The diodes are laser chips manufactured using semiconductor wafer processing techniques.

BACKGROUND

A major source of interest has been to reduce the cost and complication of the assembly of electro-optic devices through the coupling of the light into an external waveguide or other media. The desire to effectively couple light has lead to the development of vertically-emitting (surface-coupled) diodes (as opposed to edge-emitting diodes). The term "vertical" is used in the industry generally for any light output through the top and/or bottom surfaces, including, for example, light coming out at 45 degrees from the vertical. While these chips generate light horizontally (parallel to the top surface), they use gratings to change the direction of the light and couple light out top and/or bottom surfaces. The term "light" as used herein, includes not only visible light, but also infrared and ultraviolet. The term "laser" is used herein to describe light generating devices having an electrically or optically pumped active-region, including devices using two reflectors that form ends of an optical cavity and optical devices that accept a light waveform input and have an amplified light waveform as an output. Lasers generally amplify the light that is allowed to resonate in the cavity. The term "diode" is generally used herein to mean an electrically-pumped, laser chip.

In addition to the horizontal-cavity edge-emitting type of laser, there are vertical-cavity, vertically-emitting laser chips, i.e., the vertical-cavity surface emitting laser, or VCSEL. VCSELs, however, have had substantially reduced performance and a complicated device structure that does not effectively translate across the different material systems (such as GaAs to InP) for low cost manufacturing. The gain volume for VCSEL is very small and thus the output power is low. Note that VCSELs, like edge-emitters, bring light directly out, without diffracting the light.

The need for better vertically-emitting structures has driven the industry to examine a wide number of methods to couple light vertically out of a horizontal cavity structure. Proposed structures include the use of gratings (see, e.g., U.S. Pat. No. 6,219,369 to Portnoi, et al., which uses a single diode on a chip and U.S. Pat. No. 5,673,284 to Congdon, et al., which uses four stripe diodes on a chip). The classic approach to grating coupled devices is to utilize a surface blazed grating with fingers extending down into the surface of a cladding over the passive region to couple light from an active region (containing, e.g., a quantum well, a p-n homojunction or a double heterostructure) through the passive region, and then vertically out of the device. A typical such vertically-emitting laser might have an active region about 10 microns wide by 500 microns long, and two Bragg gratings as end-of cavity-reflectors, and an output grating designed both to couple light out and to reflect light to the active region as the feedback (generally about 70–90% coupled out and 10–30% fed back to give the desired narrow-band emission).

SUMMARY OF THE INVENTION

Our wafer scale processing techniques produce chip-laser-diodes with a diffraction grating that redirects output light out the top and/or bottom surfaces. Noise reflections are preferably carefully controlled, allowing significant reduction of the signal fed to the active region. Combination gratings and additional gratings and/or integrated lenses on the top or bottom of the diode can also be made utilizing wafer scale processes, reducing or even eliminating the need for the expensive discrete optical elements traditionally required to couple light out (e.g., into an optical fiber) and reducing alignment problems (prior art packaging of a diode has required tedious manual positioning of discrete optics). The diffraction grating can redirect a novel feedback from the optical output (e.g., fiber) to produce lasing that aligns itself to the fiber input, and such self-aligned lasing further reduces assembly costs.

Generally, a diffraction grating and integrated lens-grating are used herein to couple light from the chip to an output fiber, and the lens-grating is spaced from the diffraction grating. Preferably the diffraction grating and integrated lens grating are also used to couple light from the output fiber back to the active region of the chip. The integrated lens-grating can be in a coupling block. The use of a coupling block can eliminate all solid-to-air interfaces in coupling light between the chip and a fiber.

This can be an improved method of horizontally generating light within a semiconductor structure, and diffracting at least a portion of the generated light out of the structure and into an optical fiber, the method comprising providing a semiconductor substrate having a substrate with a bottom surface and having a lower metal contact on at least a portion of the substrate bottom surface; providing a core layer containing active-region, a waveguide region longitudinally-displaced from an active and a passive region with an adjacent passive-end facet, the core layer being over the substrate; providing an top cladding layer on the core layer; providing a top electrode layer over the top cladding layer; providing a top metal contact on a portion of the top electrode layer over the active region; providing grating fingers extending down into the top cladding layer over at least a portion of the waveguide region to provide a diffraction grating; providing an integrated lens-grating wherein the lens-grating is spaced by at least one-hundred wavelengths from the top grating from the diffraction grating; providing an optical fiber; and applying a voltage between the top and bottom metal contacts, whereby light is generated in the active region and at least a portion of the generated light is diffracted out of at least one of the cladding upper surface and the substrate bottom surface, and focused into the fiber by the lens-grating. In some embodiments the lens-grating is on the substrate bottom.

In some embodiments a coupling block with the optical fiber attached, is connected to the chip. In some embodiments the lens-grating is in the coupling-block. In some embodiments the diffraction grating and integrated lens-grating are also used to couple light from the output fiber back to the active region of the chip. In some embodiments an upper buffer layer is provided between the top cladding layer and the core and a lower buffer layer is provided between the substrate and the core.

This can also be an improved semiconductor laser diode comprising a semiconductor substrate; a core layer comprising an active region and a waveguide region on the substrate, the waveguide region being longitudinally-displaced from an active region, and wherein the active region comprises at least one quantum well; an upper cladding layer on the core layer; a diffraction grating comprising grating fingers extending down into the top cladding layer over at least a portion of the waveguide region; and an integrated lens-grating wherein the lens-grating is spaced by at least one-hundred wavelengths from the top grating from the diffraction grating.

This can also be a method of fabricating an improved light-generating semiconductor structure, the structure having top and bottom surfaces, the method comprising providing a semiconductor substrate; providing a core layer containing active-region, and a waveguide region longitudinally-displaced from an active region, the core layer being over the substrate; providing an top cladding layer on the core layer; providing a diffraction grating on the top cladding layer over at least a portion of the waveguide region; and providing an integrated lens-grating integrated into the diffraction grating or on the bottom surface or in a coupling block. Preferably, the lens-grating is spaced by at least one-hundred wavelengths from the diffraction grating. In some embodiments, an output fiber is provided and the lens-grating directs an output beam into the fiber and the fiber may be a single-mode fiber.

In some embodiments, a grating-containing coupling block cut from a glass wafer is attached to the fiber, the chip, or both, and the coupling block contains at least one grating selected from the group consisting of: a resonance-grating to reflect light back to the active region, a fiber-diffraction-grating to diffract light into the fiber along the fiber axis, a diffraction-grating to diffract light into the coupler and then into the fiber, a lens-grating, and a beam-shaping grating.

In some embodiments, a coupling-block having opposing faces is provided and one coupling-block opposing faces is attached to the fiber and the other opposing face is attached to the semiconductor structure. An integrated lens-grating may be within the coupling-block. The fiber may be attached to the coupling-block by a thermosetting optically-transparent adhesive which was applied to the coupling-block and/or the fiber and dried without being cured, and wherein the fiber is then placed in contact with coupling block, and the thermosetting adhesive is then cured to bond the fiber to the coupling block.

The semiconductor structure may be attached to the coupling-block by a thermosetting optically-transparent adhesive which was applied to the coupling-block and/or the semiconductor structure and dried without being cured, and wherein the semiconductor structure is then placed in contact with coupling block, and the thermosetting adhesive is then cured to bond the semiconductor structure to the coupling block. The thermosetting adhesive may be cured to bond the semiconductor structure to the coupling block at a position of essentially a maximum value of light intensity in the fiber by UV curing.

In some embodiments, the diffraction grating diffracts light both upwards and downwards and an integrated reflector directs both upwards and downwards refracted light through the integrated lens-grating into the fiber. In some other embodiments, the diffraction grating diffracts light both upwards and downwards and a topside integrated reflector directs upwards refracted light through the integrated lens-grating into the fiber.

A coupling block is preferably used herein to couple light from the chip to an output fiber, and preferably to couple feedback reflected from the fiber back to the chip. For example, a one-part coupling block can be used between the chip (e.g., adjacent a glass-filled lower grating) and a fiber, with the coupling block attached to both the chip and the fiber, with no grating on the coupling block. Alternately, a one-part coupling block can be used between a chip which does not have a lower grating, and a fiber, with the coupling block attached to both the chip and the fiber, with an integrated lens-grating on the coupling block surface that is attached to the bottom of the chip.

Another alternative is a one-part coupling block can be used between a chip which does not have a lower grating, and a fiber, with the coupling block attached to both the top chip surface and spaced from the fiber, with an integrated lens-grating on the coupling block top surface. Thus one can have a one-part coupling-block may have, or may not have, a grating on one of its surfaces. Still another alternative is to have a two-part glass coupling-block, with an internal grating between the two parts between a chip which does not have a lower grating, and a fiber, with the coupling block attached to both the top chip surface and the fiber.

One can also have coupling-blocks with more than on internal or surface gratings and the coupling-blocks can have three or more parts. Both the top grating and the internal grating can aid in the shaping (e.g., Gaussian-distribution) of the beam (preferably all rays exiting the top grating are parallel and any focusing is provided by a grating spaced, e.g., by at least one-hundred wavelengths from the top grating). The use of an internal-grating coupling-block can provide such a spaced grating. The use of a coupling block can eliminate all solid-to-air interfaces in coupling light between the chip and a fiber, and can eliminate "facet-type damage" that can occur with high interface power densities.

Preferably, bonding of parts is done with optical glue (e.g., optical epoxy) that is dried (the solvent generally is removed at moderate temperature, preferably in a vacuum), but not cured (not cross-linked) on at least one of the surfaces to be bonded, prior to assembly of the parts. The parts are then assembled and held aligned (in some cases, the diode is energized and power in the fiber is monitored during alignment) and the glue cured, possibly thermally, but preferably UV cured. While curing can be done in a vacuum, this is generally not necessary if surfaces are properly prepared. Such bonding is preferably done between fiber and coupling-block, and between coupling-block and chip, and is especially important in bonding involving and air-filled grating (e.g., an internal grating between parts of a two-part grating) as using a glue that flows during assembly will generally flow glue into grating grooves and degrade or destroy the grating.

Wafer-scale production of gratings on a wafer (e.g., a glass wafer) may also be used to produce couplers. A multiple-grating-containing wafer can be cut into small pieces (coupling-blocks). More than one such piece can be used in a coupler. A coupler is preferably attached to fiber or a chip, and preferably both. The couplers can contain one or more gratings, and the gratings on a coupler can include; a resonance-grating to reflect light back to the active region, a diffraction-grating to diffract light into the fiber along the fiber axis, a diffraction-grating to diffract light into the coupler and then into the fiber, a lens-grating, and a beam-shaping grating. Such couplers can provide spacing along the light path and eliminate grating-to-grating interference, facilitating, for example, chip-top emission into a single mode fiber. Preferably no discrete optical elements are used and all gratings are wafer-produced on the chip or on the fiber (or on a wafer-produced coupler attached to the chip or fiber), and as a result, costs are greatly reduced.

The foregoing has outlined rather broadly the features and technical advantages of the present invention in order that the detailed description that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF THE PREFERRED EMBODIMENTS

Figure 1:
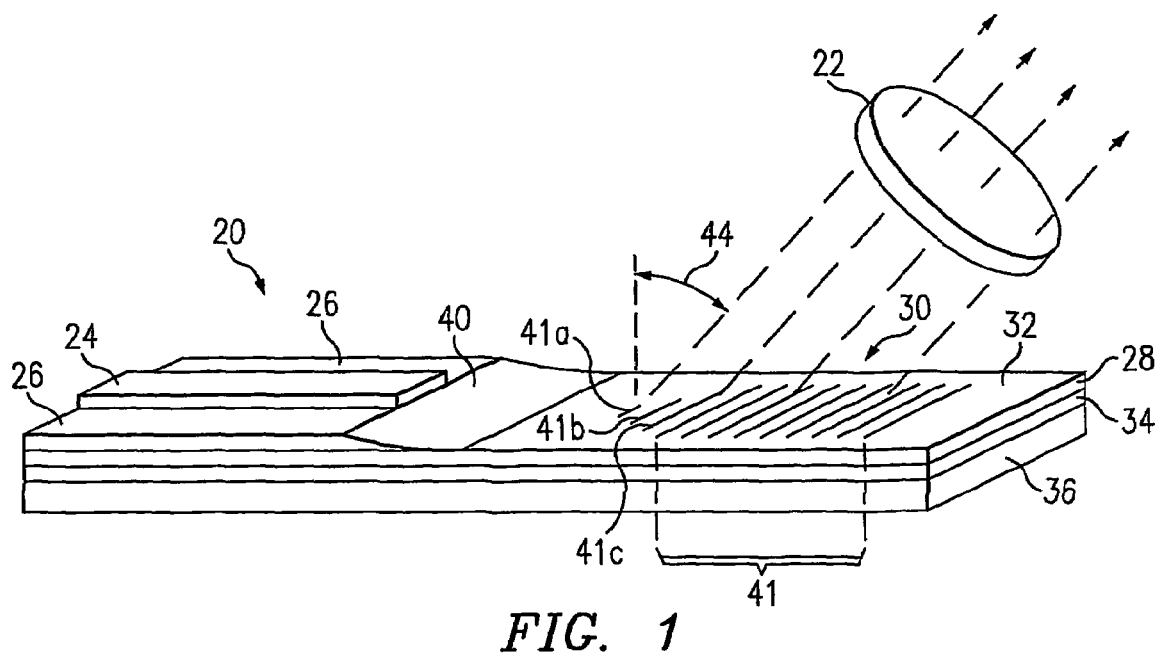
FIG. 1 shows a view of a chip-diode laser with an external feedback mirror, which laser can be tuned by tilting the mirror.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

This diode-chip-laser can provide narrow-band coherent light, (light that is virtually all in-phase and at, or essentially at, the same wavelength). These grating-coupled diode improvement enable, for the first time, combining of all the functional advantages of non-semiconductor-chip (e.g., fluid) lasers with the efficiency, economy, convenience, and the efficiencies of semiconductor-chip-manufacturing (wafer processing). These chips generate light parallel to the top surface and utilize gratings that diffract light out top and/or bottom surfaces. Thus they have both a long light generation region and a large output area, and can provide significantly higher power than prior art semiconductor-chip diodes.

Our methods and devices make enhanced beam quality achievable in high-power solid-state diodes. Our structures can substantially eliminate the more significant stray reflections in laser-diode chips, and surprisingly, this has allowed the signal (generally the feedback) to be greatly reduced (as opposed to prior art designs that have increased the feedback to get coherent light), while allowing significantly greater output power than prior art laser-diode chips. Our signal is preferably reduced to less than 4% of the output light for both internally fed-back and externally fed-back devices, as well as optical amplifier devices. The advantages of our designs generally include: more efficient coupling of light from the core into the output beam; more coherent output beam; narrower line-width output beam; and greater output power.

In external feedback embodiments, all internal reflections back into the active region are preferably essentially eliminated (including gratings with very-low reflectivity, preferably of less than 0.1% and more preferably less than 0.01% of the output light).

Further, unlike prior art gratings designed to reflect light to the active region, our gratings can be detuned to reduce not only certain stray, but also wanted (feedback) reflections from the gratings. In one type of embodiment, internal feedback is provided by the output grating, but the feedback is reduced to less than 4% of the output power.

These techniques can use a combination of an out-coupling (diffracting) grating and feedback from the output optical fiber to produce directed lasing in which the output angle of light from the chip grating aligns itself to the fiber input. The self-directed lasing especially provides a chip-fiber longitudinal alignment that greatly reduces costs, particularly when the fiber is a single-mode fiber with a core diameter of ten microns or less. A lens-grating (at least part of which can be combined with the out-coupling grating) can be used to allow higher output power. Beam-shaping by one or a combination of gratings can be used (some beam shaping can be done by a shaped top metal contact as well), e.g., to provide a Gaussian distribution for more efficient coupling into a single-mode fiber. Controlling of chip temperature can be used to control the output wavelength of the device. As noted, in some embodiments, the light distribution is also adjusted by non-linear patterning of the top contact and/or the grating entrance. One or more gratings integrated into the chip can be used to transfer a beam, preferably self-directed, from the chip directly into an optical fiber, eliminating expensive, non-integrated optics.

A view of a chip-laser diode 20 with external feedback is shown in FIG. 1. The external feedback reflector 22 shown is a partially reflecting mirror, however some preferred embodiments use other types of feedback reflectors. Output light is shown by dashed lines and has a generally cylindrical shape. The diode 22 has a top metal contact 24 on a top electrode 26.

Top cladding layer 28 has a diffracting grating 30 (the diffraction grating can be a series of grooves etched in the top surface 32 of the top cladding layer 28). An active-region-containing core 34 is under the top cladding layer 28. The active-region-containing core 34 is over (possibly with intervening layers, not shown) a semiconductor substrate 36.

Generally layers are epitaxially grown on a semiconductor wafer for the active-region-containing core 34, the top cladding layer 28, and the top electrode 26; metal is deposited and patterned and etched for the top metal contact 24 and bottom metal contact; a patterned etch exposes top surface 32 of the top cladding layer 28 leaving an anti-reflection-shaped top electrode output end 40; and the diffracting grating 30 is patterned and etched as a series of grooves in the top cladding surface 32. The wafer is then cleaved into individual diode chips.

The active region is generally the portion of the core 34 that is under the top metal contact 24. The waveguide region is generally a section of the core 34 that is under the diffracting grating 30 plus a connecting part of the core 34 between the active region and the section under the diffracting grating.

Figure 2:
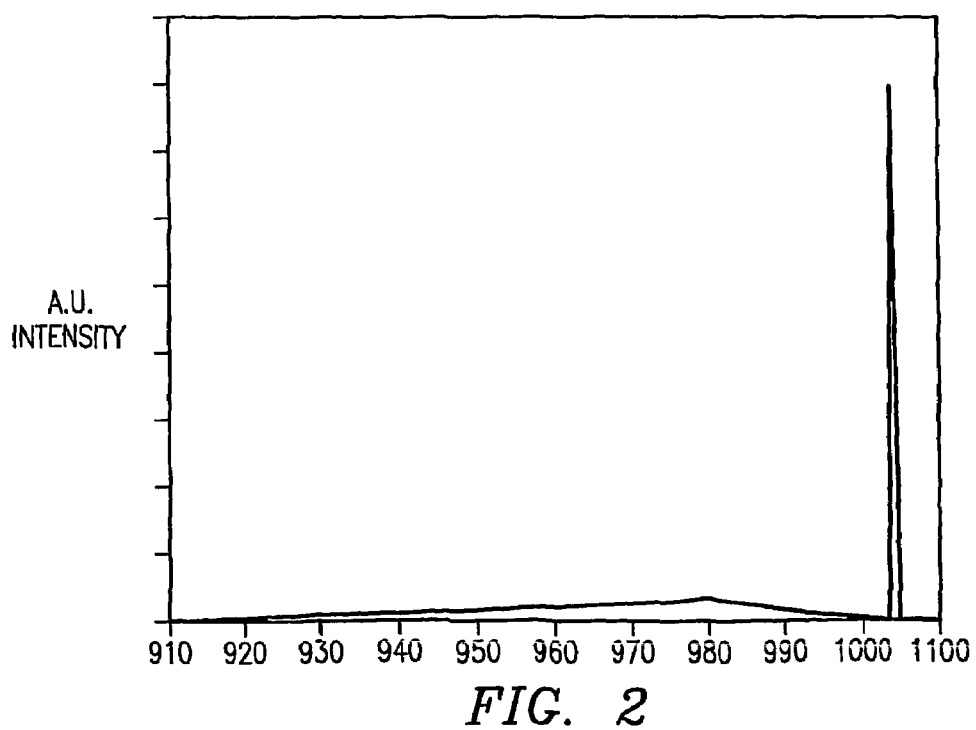
FIG. 2 shows measured output intensity as a function of wavelength in nm from a chip-diode laser.
Figure 3:
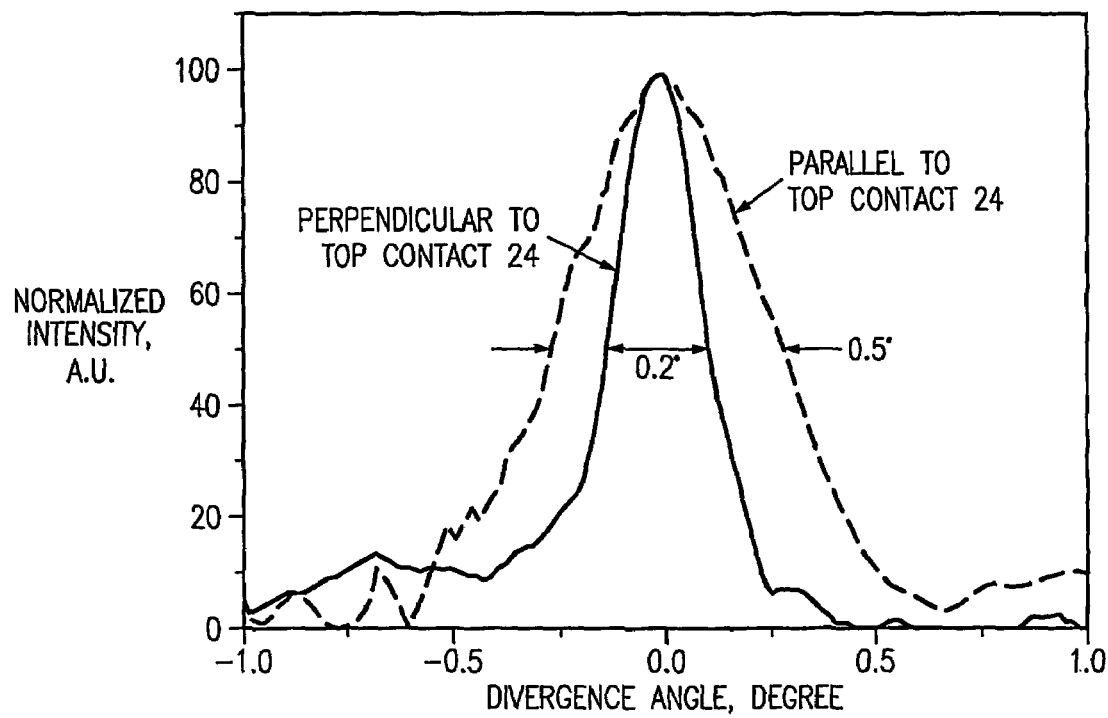
FIG. 3 shows a measured output intensity as a function of angle at which the beam diverges, both longitudinally (parallel to the top contact) and transversely (perpendicular to the top contact)

FIG. 2 shows light output as a function of wavelength, measured from one such diode. FIG. 3 shows light output as a function of wavelength, measured from one such diode.

Figure 4:
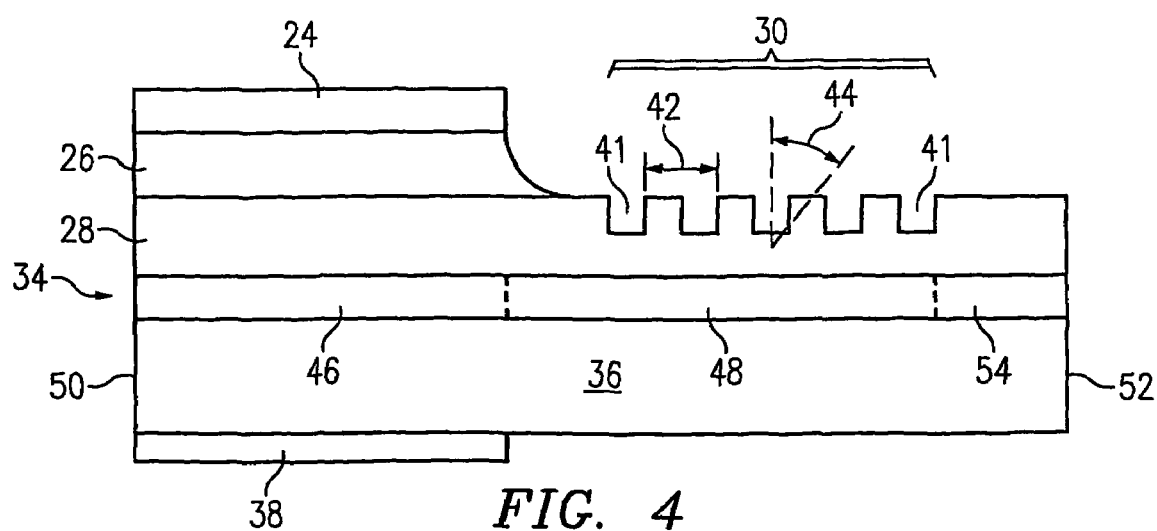
FIG. 4 shows a simplified longitudinal elevation cross-section of a structure with a tapered electrode that can be used with or without external components.

FIG. 4 shows a simplified cross-sectional elevation about the longitudinal centerline of a diode chip (generally herein, like parts are designated by like numbers). Note that the drawings are generally not to scale. In this view, the bottom metal contact 38 can be seen on the bottom of the substrate 36. The diffracting grating 30 (shown greatly enlarged and with only a small fraction of the number of grooves) has a period 42 and an output beam at an angle 44 from vertical. The wavelength of the output light from a given quantum well structure is primarily a function of diffracting grating period 42, output beam angle 44, and chip temperature. The active region 46 is generally the portion of the core 34 under the top metal contact 24 and the waveguide region 48 of the core 34 is also indicated. The chip has an active-end facet 50 and a passive-end facet 52, which were formed during the cleaving operation. The active-end facet 50 can serve as one end of the laser-diode cavity, but the passive-end facet 52 in our embodiments is generally isolated such that there is substantially no reflection from the passive-end facet 52 back to the active region 46. In some embodiments, the passive core-portion 54 (adjacent the passive-end facet 52) is processed to be anti-reflective. Here the active-end facet 50 is a reflector that serves as one end of the laser cavity and a mirror 22 that serves as the other.

In embodiments in which a device is to be an optical amplifier there are no cavity end reflectors, and a device is fabricated which is essentially two back-to-back devices of FIG. 4, (mirrored about the line of facet 50, but with no facet dividing the joined active regions, such that one grating can be used as an input, and the other as the output). Generally all the innovations herein incorporated can be used in fabricating and/or packaging optical amplifiers or even Superlume devices (which are broadband emitting devices which can use a FIG. 4 structure, but do not use a narrow-band feedback).

Figure 5:
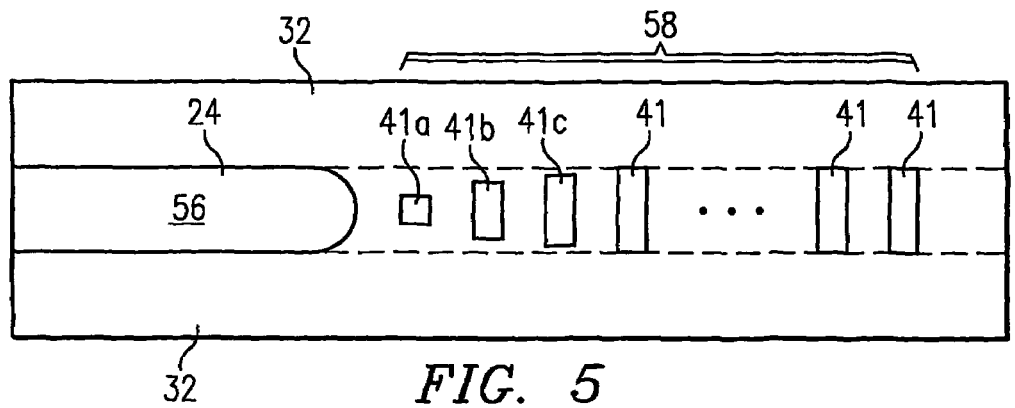
FIG. 5 shows a top view of a device with a shaped top terminal (metal contact and electrode) and a shaped grating that can provide both reflection control and beam shaping.

FIG. 5 shows a top view of a diode chip with a non-linear patterned top terminal 56 (non-linear patterned top terminal 56 can be formed by patterning and then etching both the metal contact layer and the top electrode layer) and a non-linear-patterned-entrance grating 58. Non-linear patterning can perform the functions of reflection-reduction and/or beam-shaping for either of, or both of, the top terminal 56 and the non-linear-entrance grating 58. The light intensity distribution in the output beam can be shaped, e.g., to give the beam a Gaussian distribution for more effective coupling into, e.g., a single-mode fiber. For example, making the top terminal "convex-shaped" on the end 56 towards the grating, and the grating "convex-shaped" on the end 58 towards the top electrode can make both the electrode and the grating ends essentially non-reflective and help shape the beam distribution. A finer sine-wave or other regular or irregular pattern can be superimposed on, or even to replace the smooth curve shown. With non-linear patterning, the top metal contact and the top electrode can both be dry etched (thus eliminating the less desirable wet processing) with a single patterning step. An A/R coating on the top electrode end can also be used to reduce reflections into the active region, The version of the non-linear-entrance grating 58 uses grooves 41*a*, 41*b*, 41*c*, that shorter (fingers that are not as long) at the end nearer the active region than the grooves 41 in the remainder of the grating (alternate versions use shallower grooves on this end).

Diffracting gratings can cause output light to be split into upward diffracted light beams and downward diffracted light beams, and efficiency can often be increased by combining these beams with some type of mirror (care needs be taken the obtain a generally in-phase combination).

Figure 6:
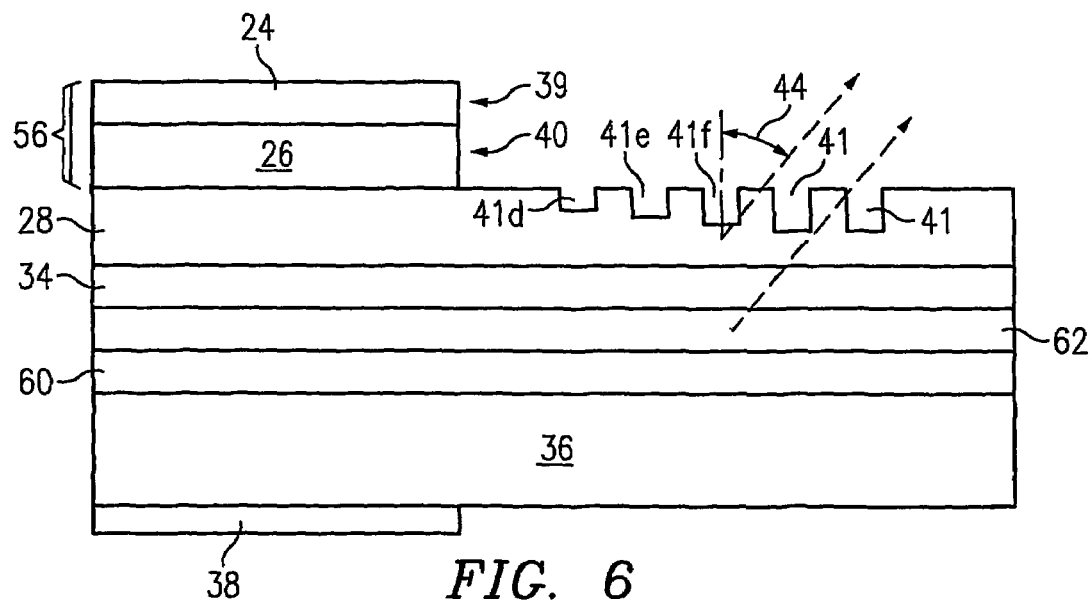
FIG. 6 shows a simplified elevation cross-section of a diode showing a grating shaping by varying the depth of grating fingers.

FIG. 6 shows a view similar to FIG. 4, but with a buried multi-layer dielectric mirror 60. The dielectric mirror 60 can have alternating layers (not shown) of materials with different dielectric constants, epitaxially grown during wafer epitaxy. The dielectric mirror 60 has a semiconductor spacer 62 (e.g., of the same material as the substrate) the dielectric mirror 60 is spaced to give in-phase combination of the beams (at the angle of beam travel by about one-quarter of the "in-material" wavelength below the grating 30 or three-quarters, one and one-quarter, etc., spacing). Note that FIG. 6 shows grooves 41D, 41E, 41F, that shallower (fingers with less depth) at the end nearer the active region than the grooves 41 in the remainder of the grating. Note also FIG. 6 shows the top metal contact 24 and the top electrode 26 with cross-sections produced by dry etch in forming top terminal 56 and also shows shaped output-end of top metal contact 39 and anti-reflection-shaped top-electrode output-end 40 shaped by dry etching. The top metal contact 39 is shaped primarily for beam shaping. When the contact 39 and electrode are etched with a single patterning, the top-electrode output-end 40 may need additional anti-reflection treatment, such as doing the patterning with a finer sine-wave or other regular or irregular pattern superimposed, and/or with an A/R coating, as noted above.

Figure 7:
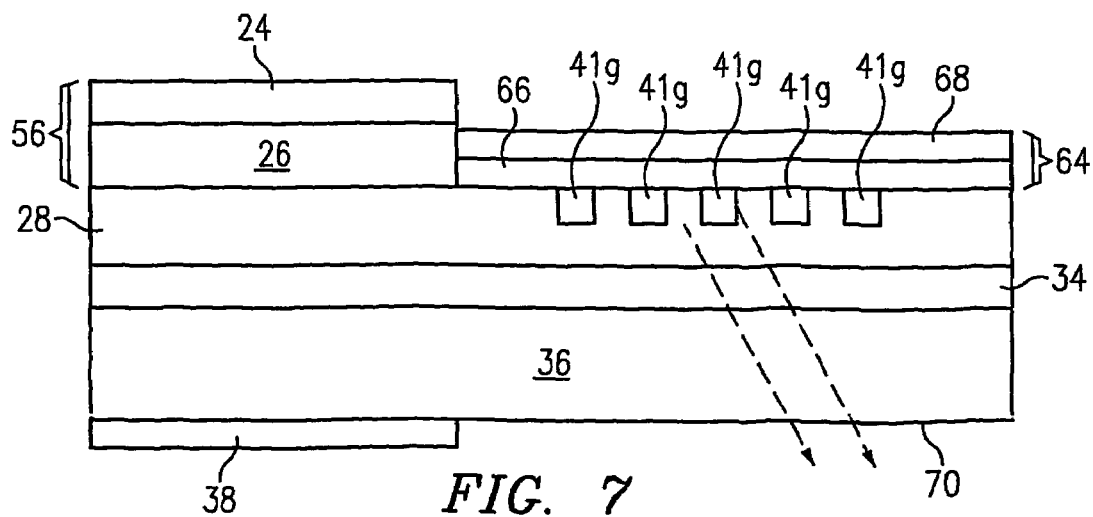
FIG. 7 shows an elevation cross-section with a top reflector and bottom-surface emission, and an ion-implanted grating.

FIG. 7 also shows a view similar to FIG. 4, but with a top mirror 64. The top mirror 64 is formed after the grating 30 is etch and has a transparent (at operating wavelength) material 66, such as silicon dioxide, deposited in the grating grooves and over the top cladding surface and a metallization 68 deposited on the transparent material 64. The top mirror 64 is spaced to give in-phase combination of the beams (e.g., by about one-quarter of the in "transparent material" wavelength, a 990 nm in air wavelength would be 660 nm in glass with an index of refraction of 1.5, or 165 nm/cosine Theta) below the grating 30. With a top mirror, the output beam passes down through the substrate and out the bottom surface 70. As the transparent material 66 may have an index of refraction less that one-half that of the semiconductor, the transparent material 66 may be more than twice as thick as the spacer 62. FIG. 7 also shows fingers 41g that are ion-implanted regions. Ion implantation done with helium or argon can convert crystalline semiconductor material into amorphous material to provide grating fingers with bottom portions extending down into the cladding over the passive region of the core. Implantation can be patterned using photoresist.

Figure 8:
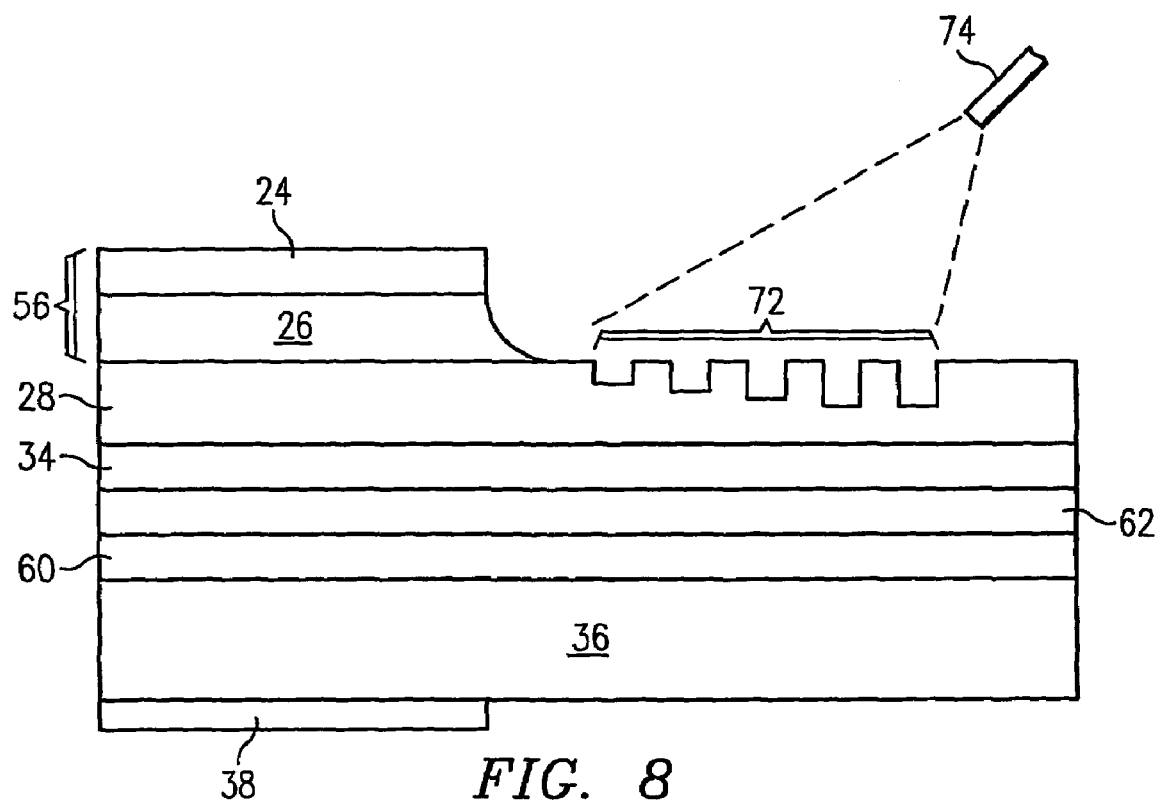
FIG. 8 shows an elevation cross-section with a buried dielectric reflector and top-surface emission, and with the emission self-aligned into an optical fiber.

The diffracting grating 30 can be modified be a combination grating that and does beam shaping as well as diffracts. FIG. 8 shows a view similar to FIG. 6, but with a combination grating 72 that diffracts and also focuses self-directed light into an optical fiber 74. The output light is self-directed due to a novel arrangement that use reflected light from the fiber as feedback. The combination grating 72 could also be used in an arrangement similar to FIG. 7, with focused light going out the bottom surface.

Figure 9:
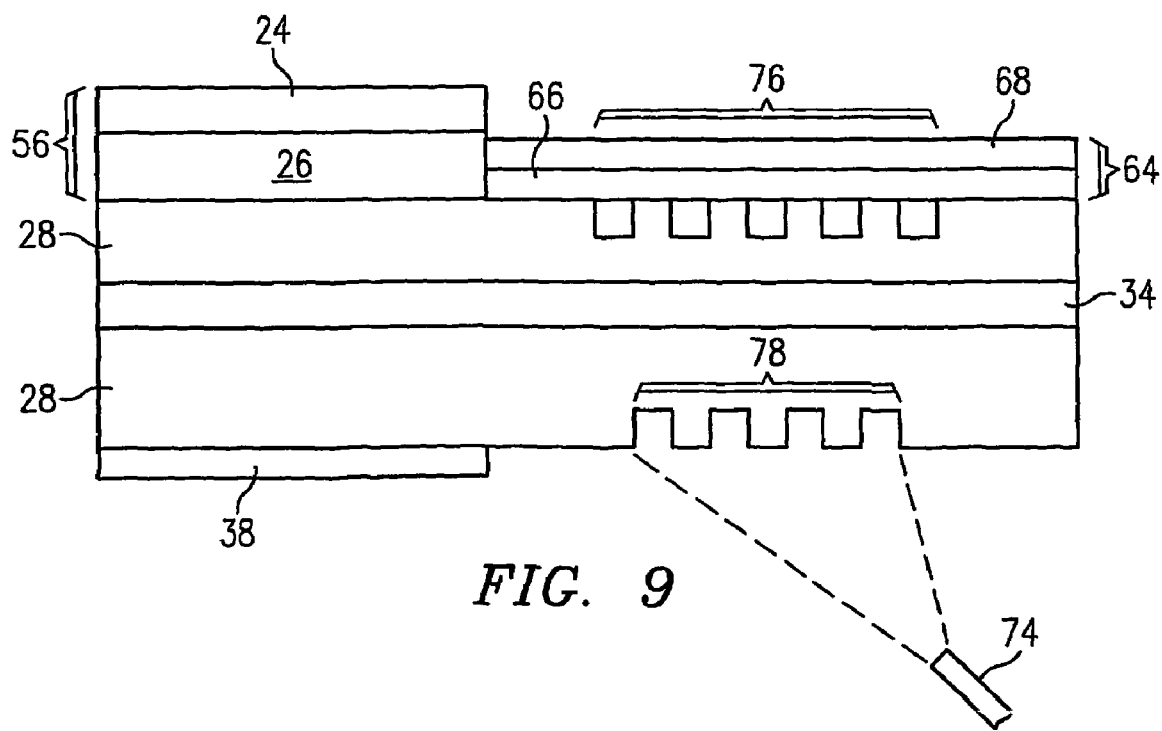
FIG. 9 shows an elevation cross-section with a top reflector and bottom-surface emission, with a lower beam-shaping grating, and with the emission self-aligned into an optical fiber.

FIG. 9 shows a view similar to FIG. 7 (FIG. 9 also uses ion-implanted fingers), with a spaced-set of upper and lower gratings 76, 78, where the use of a spaced-set allows more flexible beam shaping, e.g., diffraction (generally in the upper grating 76) and also Gaussian-distribution-adjusting and focusing in the combination of upper and lower gratings 76, 78. In some cases (not shown), a one-part coupling block (which may or may not have a surface grating) can be used between the chip (e.g., adjacent a glass-filled lower grating) and a fiber. The lower grating 78 is shown in the substrate bottom and unfilled. The grating could also be in a silicon nitride or silicon dioxide layer on the substrate bottom. In single mode operation, the light rays are generally parallel to one another, when passing between the upper grating 76 and the lower grating 78. The rays can be perpendicular to the bottom surface, or on angle (e.g., 17 or 25 degrees from vertical).

The configuration of FIG. 9 is preferred especially for low power operation, where high power-densities at air interfaces are not a major problem. Preferably the fiber is spaced at least 5, and more preferably about 6, mm from the chip. With higher power diode chips, a glass coupling-block (not shown here) can be inserted between (and optically glued to) the chip and the fiber. With a coupling-block, the fiber end and/or top of block can be angled. The coupling-block can be a glass stub, preferably at least 3 mm long (e.g., of multi-mode fiber about 100 micron diameter, preferably not graded-index, about 4 mm long). When a coupling block is used, there is preferably a controlled reflectivity joint between the coupling-block and the fiber. Coupling blocks attached by optical glue generally eliminate problems from high power-densities at air interfaces.

Alternately (also not shown), one can have top grating that diffracts and an internal (e.g., focusing) grating within a two-part, glass coupling-block. Both the top grating and the internal grating can aid in the shaping (e.g., Gaussian-distribution) of the beam (preferably all rays exiting the top grating are parallel and any focusing is provided by a grating spaced, e.g., by one-hundred wavelengths or more from the top grating). As used herein "spacing" in wavelengths is to mean wavelengths in the medium in which light is traveling, and thus the nominal output wavelength of the device corrected by dividing by the effective index of refraction of the medium. The use of a coupling block can eliminate all solid-to-air interfaces in coupling light between the chip and a fiber.

Figure 10:
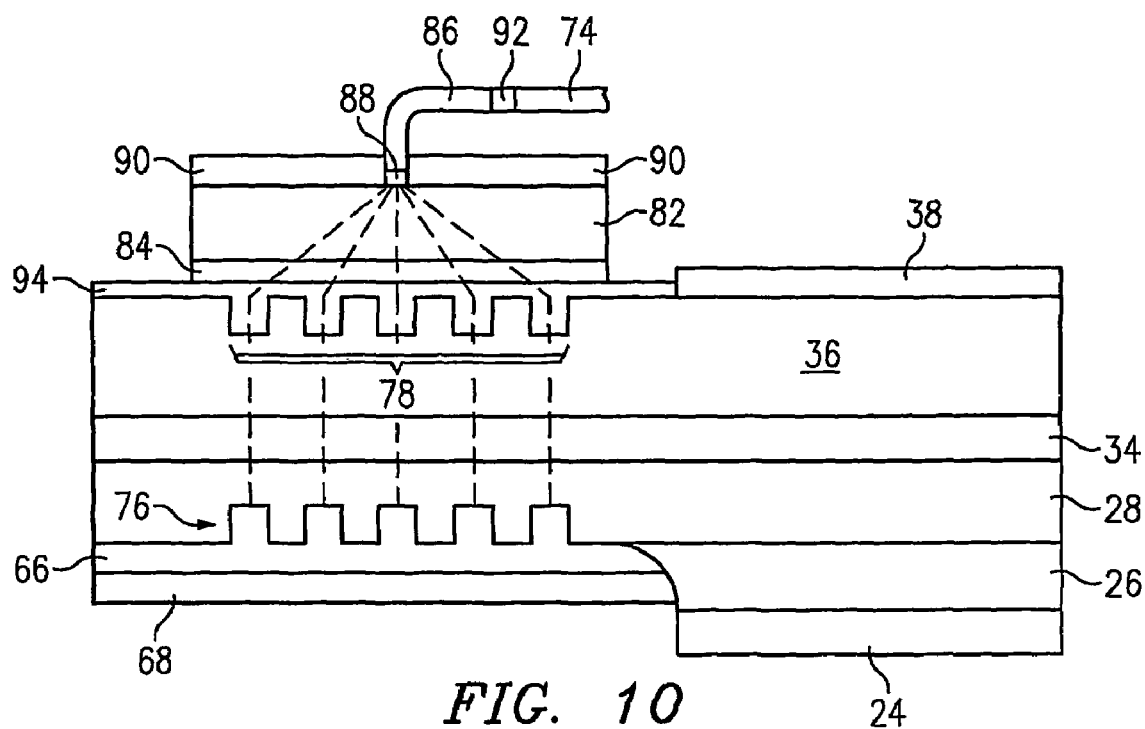
FIG. 10 shows an inverted simplified elevation cross-section of a diode, but using the same designations for like parts, with a coupling-block adjacent a "lower" grating that focuses light through a coupling block into a fiber, which fiber contains an embedded feedback reflector.

FIG. 10 shows an inverted simplified elevation cross-section of a diode, but using the same designations for like parts. The coupling-block 82 is adjacent a "lower" grating 78. The grating 78 focuses light onto the entrance of block-to-fiber stub 86. A feedback reflector 92 is embedded between the block-to-fiber stub 86 and fiber 74. The feedback reflector 92 is preferably at least 4 mm of optical path length from the "lower" grating 78, as our experiments have shown this gives better results. The coupling block 82 has an A/R coating 90, and is attached to the lower-grating fill-glass 94 of the diode by block-to-chip glue 84. The metallization 68 provides a mirror to increase efficiency. Optical glue 88 attaches fiber 74 to coupling block 82. This general arrangement can also be used for single-mode operation without the coupling block 82 (e.g., the coupling block 82, A/R coating 90, lower-grating fill-glass 94, block-to-chip glue 84, and optical glue 88 can be eliminated), but using the coupling block is preferred.

Figure 11:
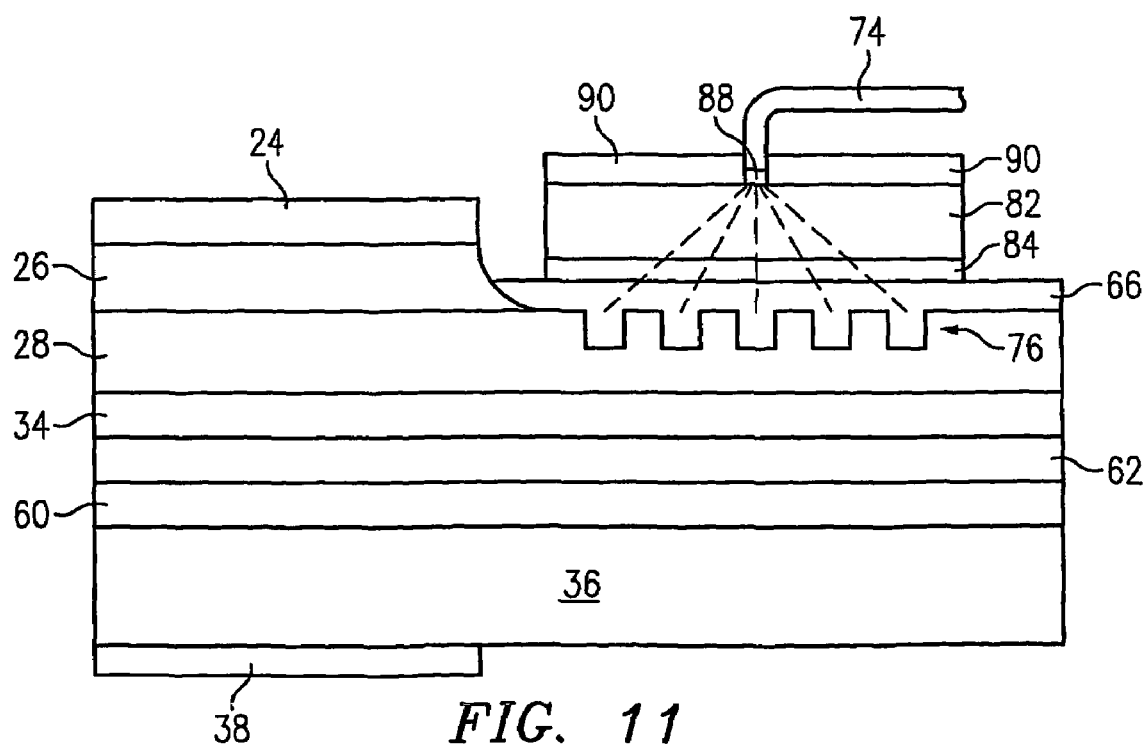
FIG. 11 shows a simplified elevation cross-section of a diode with an upper diffraction grating focusing light through a coupling block into a fiber.

FIG. 11 shows a simplified elevation cross-section of a diode with an upper diffraction grating 76 focusing light through a coupling block into a fiber. Such an arrangement can be used for broadband emission, but tends not to give single-mode operation.

Figure 12:
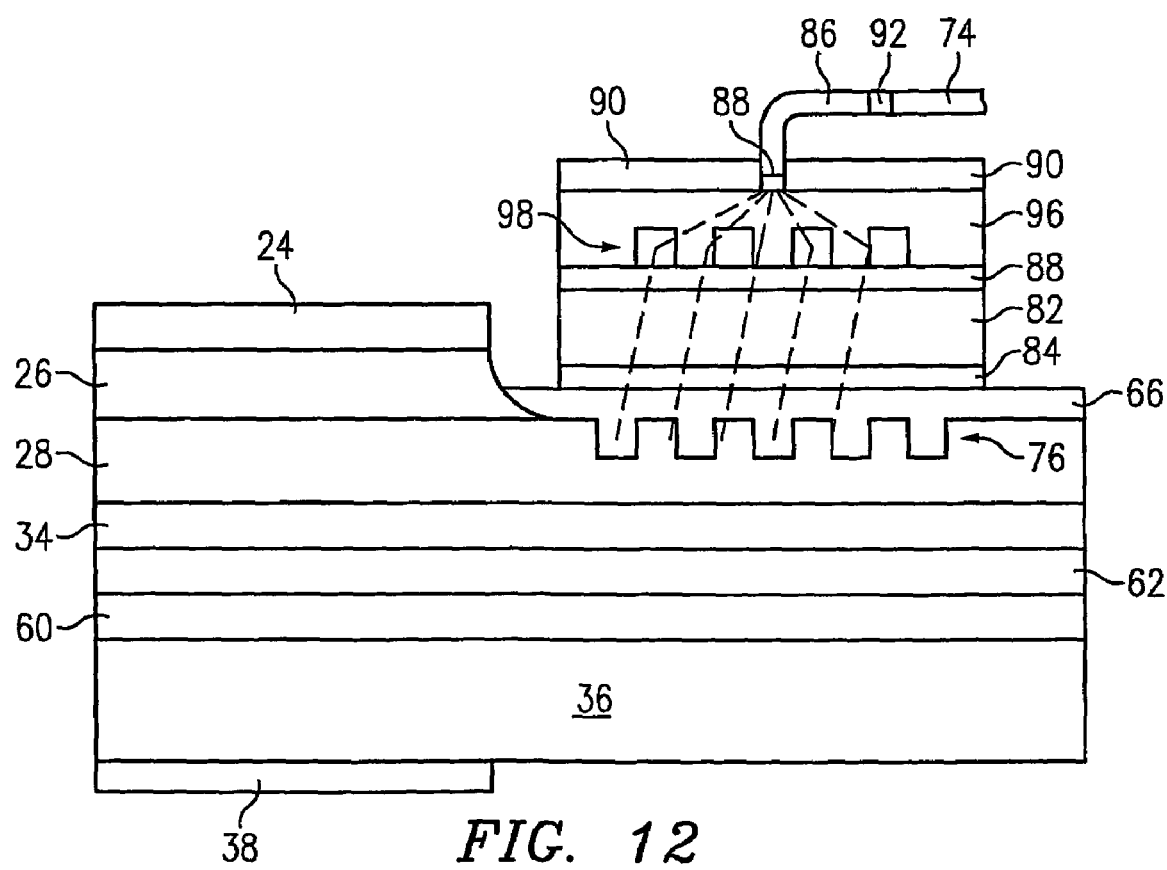
FIG. 12 shows a simplified elevation cross-section of a diode with an upper grating diffracting light through a coupling block containing a lens-grating that focuses the beam a into a fiber, which fiber contains an embedded feedback reflector.

FIG. 12 shows a simplified elevation cross-section of a diode with an upper grating 76 diffracting light through a coupling block 82 containing a lens-grating 98 and a coupling-block cap layer 96. The lens-grating 98 focuses the beam into a stub 86 and fiber 74 combination, which combination contains an embedded feedback reflector 92. The buried multi-layer dielectric mirror 60 provides a mirror to increase efficiency. Optical glue 88 attaches coupling-block cap layer 96 to the stub 86 and the coupling-block 82. Like the arrangement of FIG. 10, this arrangement can be used for single-mode operation.

We can use a flat grating-lens, and novel coupling-block-fiber unit to replace the difficult to align multiple separate (and expensive) components that have heretofore been used to couple light out of a laser diode. Our arrangement needs only one accurate positioning and that positioning needs only two-dimensional alignment. The use of the input-end of the fiber as the feedback reflector controls the lasing such that the output beam is directed into the fiber, and the spacing between faces assures that the beam is in focus when it reaches the fiber input-end. The flat surface of the lens allows the sliding of coupling-block-fiber over the surface and maintaining contact and continually measuring the light intensity while changing relative position between the lens and the coupling-block-fiber unit. When the position of maximum output power is determined, and that position is maintained while a rapid bonding process is used to bond the coupling-block (and its attached fiber) to the lens (preferably, a glass-filled lens is used). The use of a flat lens and/or the coupling-block with fiber unit provides an inexpensive and very practical way of aligning the fiber while using a lens-grating with an easily manufacturable far-field focal length.

These techniques preferably use a combination of an out-coupling diffracting grating and feedback from the output optical fiber to produce directed lasing in which the output angle of light from the chip grating aligns itself (or allows thermal aligning) to the fiber input. The self-directing fiber-feedback eliminates the need for critically aligning of each of multiple components in three-dimensions in packaging a diode (previously, this positioning has required tedious manual assembly). In some embodiments, coupling angle is self-directed and fine tuning of wavelength can be done by chip temperature. In some other embodiments, the wavelength is determined by the fiber and coupling angle is fine tuned by chip temperature. In either case, assembly is greatly simplified, and parts are eliminated (temperature controllers are not an extra part added, as they are essentially always used with such diodes). The directed lasing especially provides a chip-fiber angular alignment that greatly reduces costs, particularly when the fiber is a single-mode fiber with a core diameter of ten microns or less. In addition, some embodiments use a novel side-input on the output fiber that allows a long fiber-input, including lengths that are longer than the output beam, making the longitudinal alignment relatively easy as well, which further reduces costs.

A lens-grating (which can be combined with the out-coupling grating, especially in non-single-mode applications) can be used to allow higher output power. Beam-shaping grating can be used as well, e.g., to provide a Gaussian distribution for more efficient coupling into a single-mode fiber, and can be accomplished using a combination of gratings, generally including grating that provide other functions as well.

Directed lasing can be established which directs a coherent lasing light beam into the fiber. In some embodiments, the fiber-input face is substantially parallel to the axis. In many embodiments, a fiber-diffraction-grating on the fiber-input face or a chip bottom-side output-surface refracts light into the fiber along the axis. In some embodiments, generally including embodiments where the fiber is attached to a chip output-surface with optical glue, the grating is designed to diffract light at an angle (e.g., 25 degrees) that the difference in indexes of refraction between the semiconductor chip (e.g., GaAs) and the glass of the optical fiber refracts the light down the axis of the fiber. A positioner may be used to provide a relative angle between the fiber-input-face and the horizontal out-coupling grating, and standard semiconductor chips are manufactured and different nominal wavelength of light devices are produced by selecting different relative angle positioners. A chip-temperature controller may be used in conjunction with the relative angle to determine the wavelength of light from the semiconductor chip.

In some alternate embodiments, the wavelength of light from the semiconductor chip is determined by a resonance-grating on or in the fiber, which resonance-grating produces a resonance-determining wavelength of light that is fed back to the active layer. Wafer-scale production techniques (using semiconductor wafer production equipment) are preferably used in all gratings, including any grating on the fibers. Gratings can be defined by lithography and etched, on short lengths of fiber assembled into wafer form (the short lengths of fiber can, of course, easily be joined later to longer lengths). Wafer-scale production of gratings on a wafer (e.g., a glass wafer) may also be used to produce grating-containing light couplers that can be cut into small pieces. More than one such piece can be used in a coupler. A coupler is preferably attached to fiber, a chip, or both. The couplers can contain one or more gratings, and the gratings on a coupler can include; a resonance-grating to reflect light back to the active region, a diffraction-grating to diffract light into the fiber along the fiber axis, a diffraction-grating to diffract light into the coupler and then into the fiber, a lens-grating, and a beam-shaping grating. Such couplers can provide spacing along the light path and eliminate grating-to-grating interference, facilitating, for example, chip-top emission into a single mode fiber. Preferably no discrete optical elements are used and all gratings are wafer-produced on the chip or on the fiber (or on a wafer-produced coupler attached to the chip or fiber), and as a result, costs are greatly reduced.

This can be a method of coupling light out of a laser-diode chip into an optical fiber, the method comprising preparing a diode chip with a top side and a bottom side and output grating on the top side; integrating a digital lens with a flat lower surface and having a focal length into the bottom side of the laser-diode chip; preparing a glass coupling-block with first and second opposing coupler-faces spaced apart by the digital-lens focal-length; attaching a glass fiber to the first coupler-face; placing the second coupler-face in contact with the digital lens in the fiber, and maintaining the contact and continually measuring the light intensity while sliding the coupler on the digital lens in two dimensions; and determining a position of maximum light intensity in the fiber and bonding the digital lens to the coupling-block essentially at the position of a maximum of light intensity.

This can also be a method of coupling light out of a laser-diode chip into an optical fiber, the method comprising preparing a diode chip with a top side and a bottom side and output grating on the top side; integrating a digital lens having a focal length on a top side or the bottom side of the laser-diode chip or both; preparing at least one coupling-block with first and second opposing coupler-faces spaced apart by the digital-lens-focal-length; attaching an optical fiber to the first coupler-face; placing the second coupler-face essentially in contact with one of the digital lens in the fiber and maintaining the contact and continually measuring the light intensity while changing relative position between the digital lens and the coupler; and bonding the digital lens to the coupler at a position of essentially a maximum value of light intensity in the fiber.

The fiber can be a single mode fiber. The fiber can be attached to the coupling-block by an optically-transparent adhesive. The coupling-block can be attached by an optically-transparent adhesive. The top grating can diffract light both upwards and downwards and an integrated reflector can be used to direct both upwards and downwards refracted light through the integrated lens into the fiber. The lens-grating (preferably glass filled) can be attached to the coupling-block by a thermosetting optically-transparent adhesive which was applied to the coupling-block and/or the lens and dried without being cured, and wherein the thermosetting adhesive is then cured to bond the lens to the coupler at a position of essentially a maximum value of light intensity in the fiber, preferably by UV curing.

In one type of embodiment, a single-mode fiber has an input that has been through a lens-grating and a beam-shaping grating, and both are spaced from the fiber, (the single-mode fiber is not be direct-connected to the chip), and the emission is out the bottom of the chip. If the fiber input-face is on a side of the fiber, the fiber may have an input diffraction-grating. The resonance-producing reflection may be from the fiber input-face, or a resonance grating in the fiber. The fiber may be used with input-face non-normal to the beam or with a face having an A/R coating.

The above type of embodiments can also generally be used with a multi-mode fiber. With a multi-mode fiber, some preferred embodiments are used without a beam-shaping grating, and a combination lens-and-diffraction grating can be used and the emission could be out the top surface or bottom, including a fiber directly attached to the bottom of the chip. If direct chip attachment is used, there could be an input diffraction grating on the fiber or on the chip bottom, or the light angle could be such that refraction (e.g., a 25 degree refraction) between the chip and the fiber sends light down the fiber. If direct chip attachment is used, a resonance grating in the fiber can be used to provide the feedback reflection for self-direction of the output beam into the fiber.

In one experiment, a fiber-end-face was used to reflect a resonance-inducing portion of the light back through the grating to the active layer. A two-part positioner was used to provide a relative angle between the fiber-input-face and the horizontal out-coupling grating. The two-part positioner served to dissipate heat from both the semiconductor chip topside and bottom side. A thermoelectric chip-temperature controller was used in conjunction with the relative angle to determine the wavelength of light from the semiconductor chip. In this experiment, light was self-directed and produced efficient coupling and single-mode emission.

For single mode emission, we generally have used two separate gratings, one to beam-shape to Gaussian, and one to match spot size to fiber surface, into either single-mode or multi-mode fiber (note, however, one can reasonably efficiently couple non-Gaussian beam into a multi-mode fiber and thus one can use a fiber end-face reflection and only one, diffracting and focusing, grating). In any case, preferably two separated gratings are used to couple into a single-mode fiber.

A focusing (and diffracting) top-grating can be used with a Gaussian-shaping grating on the chip-bottom. Some embodiments use a grating on the fiber-surface (which also diffracts) on side of fiber. At optical powers higher than some level, typically a few watts, with an air-solid interface one will need a grating on the side of the fiber is preferred to increase the area of the fiber input surface. A resonance-grating in the fiber minimizes wavelength changes with temperature, can provide some self-direction to beam into attached fiber, and is convenient for giving a low level (e.g., 1%) feedback signal.

Use of fiber-side-surface can increase transfer area by projection of elliptical spot and thus avoid "facet-damage", but preferably has a fiber-input diffraction-rating unless attached with optical glue and at 25 degrees. A resonance-grating in fiber, especially if attached with optical glue, can give self-directed light. A temperature control to maintain proper angle is preferred, as otherwise, coupling efficiency may be reduced. The $3^{rd}$ order diffraction of the out-coupling grating is eliminated by a beam of about 17 degrees (from normal). The bottom grating can beam shaping (e.g., Gaussian-adjusting) and the top grating both focusing and diffracting (the beam shaping can also be in the top grating and the focusing in the bottom grating). As used herein, the term "lens-grating" means a substantially-flat lenses (including Fresnel lenses, digital lenses, and an array of micro-lens fabricated by photoresist reflow and transfer etch, as well as gratings, including implanted, that perform a lens function of changing the area of a beam of light as a primary function, and the term "beam shaping grating" means a grating which has changing the distribution of light in a direction transverse to the direction of propagation (e.g., from a skewed distribution to a Gaussian distribution) as a primary function. As such lenses can be used together to give a desired result, two (or more) lenses can both contribute to both functions, and either lens can be described by either term.

Reflection from a fiber-input (a face normal to light) can be used as feedback, rather than resonance-grating in fiber, with temperature adjusted to control wavelength. This allows increased transfer area, and can use a fiber diffraction-grating, without a fiber-resonance grating. This is a relatively simple arrangement that avoids "facet-type-damage" in the low, e.g., 1 to 20 watt, power output range. Alternately, the use of a resonance-grating in a fiber-side-surface can provide self-directed light. The fiber may be attached to the chip, or in air. The fiber-input can be a tapered fiber section which tapers from, e.g., a 100 micron diameter input face to, e.g., a nine micron diameter which can be butt-attached to a standard single-mode fiber.

Self-direction of light allows for loose tolerances. In x and y, the transfer spot can slide along output area, and alignment is relatively easy. Optical gluing of a coupling-block needs no z-alignment, and as there is no solid/air interface, thus "facet-damage", is generally not a problem, and this can give very high power capacity. Note that alignment for effective coupling directly into a single-mode fiber face (e.g., 9 micron core diameter) generally requires a 1 micron accuracy. For such devices, a 10 micron tolerance can be "relatively easy".

One bottom-emission example uses a combination diffraction and focusing grating on the top side and a multi-mode fiber attached to the bottom side. With resonance-grating in fiber, light is self-directed. This can have self-directed light when coupling angle is close to 25 degrees and no lower refraction-grating is used. Preferably a temperature control is used to maintain diffraction angle of top-grating to maintain good coupling.

Another bottom-emission example uses defraction/1-D focusing top-grating, a Gaussian-adjusting bottom grating, a single-mode fiber and fiber-side input-face in air on the bottom side. With resonance-grating in fiber, light is self-directed. This uses a diffraction-grating on the fiber-input. Preferably a temperature control is used to maintain a diffraction angle of top-grating that gives good coupling. The fiber input face in air, need not be parallel to chip output surface, as long as fiber input-grating is appropriate for beam entrance angle. The use of fiber input face at non-normal angle to the light beam avoids surface reflection feedback to active region, (and can stretch transfer-spot ellipse), allowing more power without "facet-damage" than fiber-end approach, but care needs be taken that light not be excessively reflected in other directions and wasted (e.g., an A/R coating can be used).

If the wavelength is controlled by resonance-grating, and temperature controlled by a thermoelectric cooler, one can control by sensing temperature or by sensing and maximizing power in the fiber.

If all gratings are to be on the chip or on the fiber and the fiber is a multi-mode fiber, it may be used without a beam-shaping grating. Thus a combination lens-and-diffraction grating could be used and the emission could be out the top surface or bottom, and a bottom attached fiber could be used. If direct chip attachment is used, there could be an input diffraction grating on the fiber or on the chip bottom, or the light angle could be such that refraction sends light down the fiber. If direct chip attachment is used, a resonance grating in the fiber is needed to provide the feedback reflection for self-direction of the output beam into the fiber.

In preferred embodiments, the lower portion of the core is provided by a lower graded index layer and the upper portion of the core is provided by an upper graded index layer. In some top-emitting embodiments, the buried dielectric mirror is epitaxially grown beneath the core during wafer fabrication. The grating normally causes light to go, not only out the top surface, but also down into the substrate, but the mirror directs all light out the top, increasing efficiency. The mirror is at a depth that light going down into the substrate is reflected out the top surface, and is generally in-phase with the other light going out the top surface. The depth of the mirror is preferably a function of the angle (theta, from vertical) at which the light exits the surface (4 sine Theta times the wavelength). If the light exit angle and the wavelength are adjustable, the depth can be set for the center of the adjustment range. A top mirror (and bottom emission) is convenient to give a mirror closer to the top grating, and is better at low angles from the horizontal than buried dielectric mirror (and top emission), as offset of reflected beam is less.

In some preferred embodiments, where the grating fingers are formed by changing portions of the crystalline semiconductor (with an index of refraction typically above 3) into an amorphous state (with an index of refraction typically about 1.5), the ion implantation is with, e.g., helium or argon. Preferably implantation angled at between 2 and 10 degrees from vertical is used to produce slanted fingers tilted between 2 and 10 degrees from vertical.

In GaAs substrate embodiments, prior art gratings have generally been in an AlGaAs layer. In most preferred GaAs embodiment, our diodes have an InGaP layer epitaxially grown over (preferably directly on the top of) the core (in particular over a GRIN layer which is the top of the core). This can provide an etch-stop-layer for accurate vertical location of the top the grating, and, when a grating is etched into it, provides an aluminum-free grating (avoiding problems of aluminum oxidation), and also enables fabrication of saw-tooth gratings using anisotropic etching of InGaP.

In external cavity embodiments, the reflection from the grating into the active region is reduced, preferably to less than 0.1 percent of the intensity of the light entering the waveguide from the active region (and more preferably to less than 0.01%, and still more preferably to less than 0.001%). This can be done by at least one of the following: a combination of grating spacing and finger depth to reduce the zero-order and second-order of the grating to at least near minimum for the operating wavelengths; increasing the vertical distance between the grating and the core; and using a grating with saw-tooth or sinusoidal cross-section. In many such embodiments, the reflector is placed 5 or 6 mm from the diffraction grating and may placed within an optical fiber.

By lowering reflections from the output grating, the passive-end facet, the electrode end nearest the grating, and the grating-end nearest the active region, a very low intensity feedback signal can be used. Typically Fabre-Perot diodes use a feedback of about 30 percent of the intensity of the light exiting from the active region. Output gratings of grating-coupled diodes are generally designed to "optimize" (increase) their reflectance, generally to 20 or 30%. Our technique uses less than 10% (and more preferably to less than 4%, and still more preferably to less than 1%). Prior art lasers typically have about 90% intensity at the facet near the electrode and are limited in power by intensity-related facet damage. Our diodes preferably have between 10% and 20% of active-region-output intensity at the electrode end facet (and far less at the passive-end facet).

While the passive-end-reflectors of our cavities are preferably facets (especially metallized facets), these techniques can also be used with Bragg gratings as the active-end-reflector.

Our grating can couple output light "vertically" out of a horizontal-active-region (e.g., quantum well) device. They minimize loss and noise producing reflections back into the active region. Stray reflections may be eliminated, e.g., by dispersing or absorbing the light. This minimizing the loss and noise producing reflections, allows the desired feedback reflections to be reduced as well. Power output in a typical edge-emitting diode is generally limited by facet damage on the active-end facet, while our surface output area is much larger and allows much higher output. Power output in prior surface-emitting lasers has been limited by facet damage on the passive-end facet. Our lowering of the feedback lowers the power at this facet, and allows higher output power. While some diodes use Bragg gratings as reflectors in place of the active-end facet, these are more difficult to fabricate and less reflective than metallized facets, and thus such diodes are generally both more expensive and less effective than our devices.

Such a grating can also be constructed in a manner that allows the grating to interact with the electromagnetic radiation in the core of the diode producing an imbedded optical element (e.g., etalon and/or echelette) in a solid-state diode. The design of this intra-cavity optical element can allow the modification of the emission laser diode to produce, e.g., very-narrow-line-width light, similar to any of the modifications which have been done in fluid lasers (including partially gas, partially liquid, dye lasers), but never before integrated within the solid state device.

Generally, this is a horizontal cavity laser diode structure with top and/or bottom surface output. Electrically-pumped, diode structures can be made in a traditional manner on a wafer of the desired semiconductor material. A high spatial resolution grating can be exposed in photoresist onto the top surface of the structure, here, over the passive region, but not over the active region, utilizing e.g., an angled 5 degrees from vertical RIE etching. While the grating can be left unfilled, in some embodiments, grating is then filled, e.g., with a SiO$_2$ glass with an index of refraction ~1.5, deposited, e.g., by CVD (e.g., PEMOCVD).

A mechanically tunable configuration of figure was successfully used in experiments to prove the viability of the concept utilizing an external optical element. "Mechanically tunable", as used herein generally means changing the output wavelength other than by changing the temperature of (at least a portion of) the laser diode or by controlling a current passing through the laser diode. An essentially non-reflecting grating coupled light out (and back in from the mirror). Feedback and passive-end reflection was provided by a movable external, partially-reflecting mirror.

The core, e.g., in a single quantum well GaAs diode may be 0.4 micron high (a little over one wavelength high for the wavelength in this medium) and contain lower and upper GRIN layers below and above a 6 nanometer quantum-well. There also may a lower semiconductor cladding layer about 1 micron high of e.g., AlGaAs) below the core. The portion of the core directly below the upper electrode is the active region and the remainder of the core is sometimes described as a passive region. The passive region is longitudinally-displaced from the active region. The upper semiconductor cladding may be an AlGaAs layer, but is preferably InGaP, e.g., 0.3 micron thick. The top electrode 26, is preferably of highly doped semiconductor. The grating in upper semiconductor cladding has spaced fingers (there were actually hundreds of fingers in our experiments, but only about five are shown for drawing convenience). When a voltage is applied between the top and bottom electrodes, light is generated in the active region. The length grating is preferably at least one-and-a-half times as long (e.g., 600 microns) as the active region (e.g., 300 microns). The grating fingers 36 may have tilted sides and bottoms to reduce the reflection from the grating back into the active region. A 2 to 10 degree tilt has been found to aid in reducing stray reflection from the grating.

Preferably, the electrode material is highly-doped semiconductor and has a metal contact on the outer surface. In one preferred embodiment, the metal directly on the highly-doped semiconductor is tungsten deposited by CVD (preferably using hydrogen reduction from tungsten hexafluoride). The CVD deposition of tungsten is described in U.S. Pat. No. 3,798,060 "Methods for fabricating ceramic circuit boards with conductive through holes" by Reed and Stoltz. The surface of the tungsten may then be coated with gold (also described in the above patent) or first nickel, then gold. Molybdenum-copper and tungsten-copper can also be used over the CVD tungsten. This tungsten metal contact system may be used as part of the top contact, the bottom contact, or both.

A grating design principle for a tunable configuration of FIG. 1 was based on the grating equation: $d(n_{\textit{eff}}-\text{Sine Theta})=k\lambda$, where k is diffracted order and is an integer, $\lambda$ is the wavelength of the electromagnetic radiation, d is the grating period (see 42 of FIG. 4, the start of one finger to the start of the next), $n_{\textit{eff}}$ is the effective index of refraction of the grating (generally experimentally determined, but generally only slightly less than the semiconductor material of the cladding, e.g., here 3.29 as compared to the 3.32 of GaAs) and Theta (output beam angle from vertical, 44 of FIG. 1) is the angle of the feedback mirror. The bottoms of the fingers utilized may be slanted at 5 degrees from the horizontal. The slant is preferably at least 1 degree and is more preferably between 2 and 10 degrees (because of the angled etch, the walls were also slanted at about the same angle).

Etching channels for the fingers in the top cladding can create the grating. The fingers pass into the upper optical guiding cladding. The design of the grating takes into account the period, depth, aspect ratio, terminating shape, and index of refraction of the semiconductor material and grating filling material. In the internal fed-back devices, the frequency of the diode can be influenced by the angle of the termination plus other elements of the structure of the grating.

The structure controls reflection of optical noise (stray frequencies) into the active region of the laser diode. Three different sources of optical feedback (noise) due to reflections are: the reflection due to the termination of the top electrode, the reflection from the facet at the passive end of the core, and unwanted reflections from the output grating.

Controlling the shape of the top electrode at the termination can control the reflection due to the termination of the electrode (in the prior art it has been flat and perpendicular to the light in the core). The major at contribution to this effect is the end of the top electrode closest to the output region. The top electrode end closest to the output region may be shaped so that it is tapered with depth toward the passive region (see FIG. 4) by a wet etch. Conceptually, this can be like the termination of a microwave structure in a horn to control reflections. While the opposite end could be tapered in the opposite direction, this has not yet proved necessary. A non-flat shaping (in plan view, see FIG. 5) can be used and can be dry etched. These shapings can be alternately or in combination.

The second noise is the reflection of light from facet 52 at the end of the passive region of the structure. The combination of the grating design and the length in the passive region can create a device structure such that allows very little light reaches the facet 52 at the end of waveguide/passive region of our device. This dramatically reduces the optical noise that is reflected to the active region. This is in contrast to traditional edge emitting diodes or Bragg grating de-coupled diodes that use this facet as one of the reflectors of the resonator cavity of the laser.

In the past, the reflection from the grating has been a maximized signal to be larger than the other sources of reflection. In our preferred structures, the other reflections are substantially eliminated and the grating reflection is reduced. This allows a low feedback reflection for internal cavity devices and substantially eliminated reflection for external cavity devices.

In one embodiment, a diode structure was designed to control the reflections to produce a diode with no external components and the feedback reflection was provided by the grating. The grating in this example is to be reflecting and thus the grating constant d may equal $k\lambda/n_{\textit{eff}}$, such that the output light was essentially normal to the surface. Even thought the grating is reflecting back into the active region, the reflection is reduced as described herein to less than about 4% of the power from the active region.

Even with a diffracting grating 30, unless appropriate measures are taken (e.g., greater grating 30 length, greater passive core-portion 54 length, adsorbing of light via reverse biased electrode above and below the passive core-portion 54 or via ion-implantation of the passive core-portion 54, wet etch taper of the passive core-portion 54, and/or anti-reflective coating of passive-end facet 52, there is some reflection from the passive-end facet, and a higher feedback from the grating is required to avoid the above broadband emission. Our preferred core and grating can be about 100 microns wide.

Material in the quantum well layer in the waveguide region absorbs light at the output wavelength, and while some is reemitted, some inefficiency results. Efficiency can be improved by disordering this material. This can be done by implanting ions down through the top surface and into this area (while shielding the active region, e.g., with photoresist). As such ion implantation generally lowers the transparency of the waveguide, it is preferable to anneal the structure after ion implantation. The preferred procedure is rapid thermal anneal (RTA) by one or more short pulses of high intensity light from tungsten lamps (again while shielding the active region). while this disorders such parts of the quantum well layer, it can generally done so as not to require an anneal after the treatment (the high intensity light is broad band, but the waveguide, other than the quantum well layer, is relatively transparent to the light and much more of the energy is absorbed in the quantum well, as compared to the rest of the waveguide). Such parts of the quantum well layer can also be disordered by "laser-induced-disordering" by energy from a laser tuned to the absorption wavelength of the quantum well, and, as the energy absorption in the device being treated is principally in the quantum well layer being disordered, a post-anneal is generally not required.

Optical filters can be used with RTA to substantially eliminate light of unwanted wavelengths (especially wavelengths which heat the non-quantum well parts of the waveguide). The RTA is effective, cheaper, and faster, and is preferred.

In some, especially mechanically-tuned-diode, embodiments, this can be a method or laser diode that generates light within a III–V semiconductor structure at a wavelength of about 1550 nm and diffracts light out a top and/or bottom surface of the semiconductor structure, and includes: using an InP semiconductor substrate; a horizontal core layer comprising an active region and a passive region, an upper cladding layer; and applying a voltage between top and bottom metal contacts, whereby light is generated in the active region and a substantial portion of the generated light is transferred out a top surface over the passive region. Generally, all layers except the quantum-well-containing layer, and, are lattice matched. In some embodiments, an upper AlGaAS buffer layer is provided between the top cladding layer and the core and a lower AlGaAS buffer layer is provided between the substrate and the core.

Generally the semiconductor laser diodes are of III–V compounds (composed of one or more elements from the third column of the periodic table and one or more elements from the fifth column of the periodic table, e.g., GsAs, AlGaAs, InP, InGaAs, or InGaAsP). Other materials, such as II—VI compounds, e.g., ZnSe, can also be used. Typically lasers are made up of layers of different III—V compounds (generally, the core layer has higher index of refraction than the cladding layers to generally confine the light to a core). Semiconductor lasers have been described, e.g., in Chapter 5, of a book entitled "Femtosecond Laser Pulses" (C. Rulliere—editor), published 1998, Springer-Verlag Berlin Heidelberg New York. The terms "patterning" or "patterned" as used herein generally mean using photoresist to determine a pattern as in semiconductor type processing.

Traditionally, edge-emitting laser-diode chips optically coupled through lenses to output fibers, have provided output light ("laser emission") horizontally, with good energy efficiencies, reasonable yields, and the laser chip manufacturing efficiencies of wafer processing. Most edge-emitting laser diodes have a semi-reflecting (about 30% reflecting) passive-end (far end) facet, which provides both the output of the edge-emitting laser diode and the feedback Some edge-emitting lasers have used gratings as near-end (end nearer the active region) reflectors for the cavity and/or stabilizing (wavelength-narrowing) feedback, but not for output coupling. Their stabilizing feedback back to the active region is generally about 30% of the light from the active region from the exit facet to give a narrow-band emission. In some other cases the stabilizing feedback has been from a fiber-optic pigtail, external to an edge-emitting chip, e.g., with an A/R (anti-reflecting) coating on the exit facet. Although difficult to align with the output fibers (unlike grating-coupled devices, edge-emitting diodes do not couple effectively through a range of angles), these device designs have worked well for multiple wavelengths with a variety of materials such as GsAs, InP, and others.

Generally, our wafer scale processing techniques produce chip-laser-diodes with a diffraction grating that redirects output light out the top and/or bottom surfaces. Noise reflections are carefully controlled, allowing significant reduction of the signal fed to the active region. Generally, a diffraction grating and integrated lens-grating are used herein to couple light from the chip to an output fiber, and the lens-grating is spaced from the diffraction grating. Preferably the diffraction grating and integrated lens grating are also used to couple light from the output fiber back to the active region of the chip.

The integrated lens-grating can be in a coupling block. The use of a coupling block can eliminate all solid-to-air interfaces in coupling light between the chip and a fiber, and can eliminate "facet-type damage" that can occur with high interface power densities. A coupling block is generally used herein to couple light from the chip to an output fiber, and preferably to couple feedback reflected from the fiber back to the chip.

In addition to very high power coherent light, our grating-coupled diode also enables additional gratings and/or lenses on the top or bottom of the diode utilizing wafer scale processes. This dramatically reduces or even eliminates the need for the discrete optical elements traditionally required to couple light into a fiber and the need for critically aligning of each of multiple components in three-dimensions in packaging a diode (previously, this positioning has required tedious manual assembly).

Combination gratings and additional gratings and/or integrated lenses on the top or bottom of the diode can also be made utilizing wafer scale processes, reducing or even eliminating the need for the expensive discrete optical elements traditionally required to couple light out (e.g., into an optical fiber) and reducing alignment problems (prior art packaging of a diode has required tedious manual positioning of discrete optics). The diffraction grating can redirect a novel feedback from the optical output (e.g., fiber) to produce lasing that aligns itself to the fiber input, and such self-aligned lasing further reduces assembly costs.

The examples used herein are to be viewed as illustrations rather than restrictions, and the invention is intended to be limited only by the claims. For example, the invention can apply to other semiconductor materials such as II–VI compounds. In some embodiments of a GRaded INdex (GRIN) structure is used. In some embodiments, an InP laser diode generates light within a III–V semiconductor structure at a wavelength of about 1550 nm out a surface of the semiconductor structure. Note also that the fingers of the grating can be silicon dioxide glass and thus can have an index of refraction the same as that of the optical fiber, or can be filled with air.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of horizontally generating light within a semiconductor structure, and diffracting at least a portion of the generated light out of said structure and into an optical fiber, said method comprising:
   providing a semiconductor substrate having a substrate with a bottom surface and having a lower metal contact on at least a portion of said substrate bottom surface;
   providing a core layer containing an active-region, a waveguide region longitudinally-displaced from an active and a passive region with an adjacent passive-end facet, said core layer being over said substrate;
   providing a top cladding layer on said core layer; providing a top electrode layer over said top cladding layer,
   providing a top metal contact on a portion of said top electrode layer over said active region;
   providing grating fingers extending down into said top cladding layer over at least a portion of said waveguide region to provide a diffraction grating;
   providing an integrated lens-grating wherein the lens-grating is spaced by at least one-hundred wavelengths from the top grating from the diffraction grating;
   providing a coupling block with an optical fiber attached, said coupling block connected to said semiconductor substrate; and
   applying a voltage between said top and lower metal contacts, whereby light is generated in said active region and at least a portion of the generated light is diffracted out of at least one of said cladding upper surface and said substrate bottom surface, and focused into said fiber by said lens-grating.

2. The method of claim 1, wherein said lens-grating is on said substrate bottom.

3. The method of claim 1, wherein said lens-grating is in said coupling-block.

4. The method of claim 1, wherein said diffraction grating and integrated lens-grating are also used to couple light from the output fiber back to the active region of the semiconductor substrate.

5. The method of claim 1, wherein an upper buffer layer is provided between said top cladding layer and said core and a lower buffer layer is provided between said substrate and said core.

6. A semiconductor laser diode, said laser diode comprising:
   a semiconductor substrate;
   a core layer comprising an active region and a waveguide region on said substrate, said waveguide region being longitudinally-displaced from an active region, and wherein said active region comprises at least one quantum well;
   an upper cladding layer on said core layer;
   a diffraction grating comprising grating fingers extending down into said top cladding layer over at least a portion of said waveguide region;
   an integrated lens-grating wherein the lens-grating is spaced by at least one-hundred wavelengths from the diffraction grating; and
   a coupling block connected to said semiconductor substrate and to an optical fiber.

7. A method of fabricating a light-generating semiconductor structure, said structure having top and bottom surfaces, said method comprising:
   providing a semiconductor substrate;
   providing a core layer containing an active-region, and a waveguide region longitudinally-displaced from an active region, said core layer being over said substrate;
   providing a top cladding layer on said core layer;
   providing a diffraction grating on said top cladding layer over at least a portion of said waveguide region;
   providing an integrated lens-grating integrated into said diffraction grating or on said bottom surface or in a coupling block cut from a glass wafer and attached to an optical fiber, said semiconductor substrate, or both; and
   providing at least one grating in said coupling block, wherein the at least one grating is selected from the group consisting of: a resonance-grating to reflect light back to the active region, a fiber-diffraction-grating to diffract light into the fiber along the fiber axis, a diffraction-grating to diffract light into the coupler and then into the fiber, the lens-gating, and a beam-shaping grating.

8. The method of claim 7, wherein an output fiber is provided and said lens-grating directs an output beam into said fiber.

9. The method of claim 8, wherein the fiber is a single-mode fiber.

10. The method of claim 8, wherein a coupling-block having opposing faces is provided and one coupling-block opposing face is attached to the fiber and the other opposing face is attached to the semiconductor structure.

11. The method of claim 10, wherein an integrated lens-grating is within the coupling-block.

12. The method of claim 8, wherein the diffraction grating diffracts light both upwards and downwards and an integrated reflector directs both upwards and downwards refracted light through the integrated lens-grating into the fiber.

13. The method of claim 8, wherein the diffraction grating diffracts light both upwards and downwards and a topside integrated reflector directs upwards refracted light through the integrated lens-grating into the fiber.

14. The method of claim 10, wherein the fiber is attached to the coupling-block by a thermosetting optically-transparent adhesive which was applied to the coupling-block and/or the fiber and dried without being cured, and wherein the fiber is then placed in contact with the coupling block, and the thermosetting adhesive is then cured to bond the fiber to the coupling block.

15. The method of claim 10, wherein the semiconductor structure is attached to the coupling-block by a thermosetting optically-transparent adhesive which was applied to the coupling-block and/or the semiconductor structure and dried without being cured, and wherein the semiconductor structure is then placed in contact with the coupling block, and the thermosetting adhesive is then cured to bond the semiconductor structure to the coupling block.

16. The method of claim 15, wherein the thermosetting adhesive is cured to bond the semiconductor structure to the coupling block at a position of essentially a maximum value of light intensity in the fiber by UV curing.

17. The method of claim 8, wherein the lens-grating is spaced by at least one-hundred wavelengths from the diffraction grating.

18. The semiconductor laser diode of claim 6, wherein the coupling block contains the integrated lens-grating.

19. The semiconductor laser diode of claim 6, wherein the integrated lens-grating is on a bottom of the semiconductor substrate.

20. The semiconductor laser diode of claim 6, wherein the coupling block contains at least one grating selected from the group consisting of: a resonance-grating to reflect light back to the active region, a fiber-diffraction-grating to diffract light into the fiber along the fiber axis, a diffraction-grating to diffract light into the coupler and then into the fiber, the lens-grating, and a beam-shaping grating.

* * * * *